US012695039B2

(12) United States Patent
Lawton

(10) Patent No.: US 12,695,039 B2
(45) Date of Patent: Jul. 28, 2026

(54) DRIVER FOR DRIVING AN ELECTROMECHANICAL DEVICE

(71) Applicant: Renesas Electronics America Inc., Milpitas, CA (US)

(72) Inventor: Joshua Lawton, Franklin, MI (US)

(73) Assignee: Renesas Electronics America Inc., Milpitas, CA (US)

( * ) Notice: Subject to any disclaimer, the term of this patent is extended or adjusted under 35 U.S.C. 154(b) by 422 days.

(21) Appl. No.: 18/337,505

(22) Filed: Jun. 20, 2023

(65) Prior Publication Data

US 2024/0429010 A1 Dec. 26, 2024

(51) Int. Cl.
H01H 47/32 (2006.01)
H03K 17/56 (2006.01)

(52) U.S. Cl.
CPC ............. H01H 47/32 (2013.01); H03K 17/56 (2013.01); H03K 2217/0063 (2013.01); H03K 2217/0072 (2013.01)

(58) Field of Classification Search
CPC ...... H01H 47/32; H01H 47/325; H01H 47/00; H03K 17/56; H03K 2217/0063; H03K 2217/0072
See application file for complete search history.

(56) References Cited

U.S. PATENT DOCUMENTS 5,729,164 A * 3/1998 Pattantyus .............. B60T 8/885
327/333
7,823,860 B2 * 11/2010 Ueda .................... H03K 17/687
361/156
9,728,359 B1 * 8/2017 Katrak ............. G01R 19/16566
(Continued)

FOREIGN PATENT DOCUMENTS

CN 104934929 A * 9/2015
DE 10231198 A1 * 1/2004 .............. H02M 1/32
(Continued)

OTHER PUBLICATIONS

"Driving Contactors with external PWM", Gigavec Application Note AN-016, 3 pages, retrieved 2023 from https://www.sensata.com/sites/default/files/a/Sensata-gigavac-driving-contactors-with-external-pwm-app-note.pdf.
(Continued)

*Primary Examiner* — Dharti H Patel
(74) *Attorney, Agent, or Firm* — SCULLY, SCOTT, MURPHY & PRESSER, P.C.

(57) ABSTRACT

A driver for driving an electromechanical device having a solenoid and a mechanical switch. The driver includes an input port, a ground port, first and second output ports connectable to the electromechanical device; and two power switches. A controller operates in a first mode to charge the solenoid and close the mechanical switch, a second mode to maintain the mechanical switch closed, and a third mode to discharge the solenoid and open the mechanical switch. In the first and second modes, the low-side power switch is on and the high-side power switch is controlled to switch between an on-state and an off-state by the controller. In the on-state a path is formed between the input port and ground via the high-side and low-side power switches, and the solenoid. In the off-state a path is formed between ground and ground via a ground diode, the solenoid and the low-side power switch.

15 Claims, 19 Drawing Sheets

(56) References Cited

U.S. PATENT DOCUMENTS

| | | | | |
|---|---|---|---|---|
| 10,536,032 | B2 * | 1/2020 | Hayes | G01R 19/25 |
| 2006/0227487 | A1 * | 10/2006 | Cutter | H03K 17/6874 |
| | | | | 361/139 |
| 2016/0042899 | A1 * | 2/2016 | Zhou | H01H 47/002 |
| | | | | 361/160 |
| 2016/0202305 | A1 * | 7/2016 | Umeno | G01R 31/52 |
| | | | | 324/509 |
| 2017/0126165 | A1 * | 5/2017 | Rechberger | H02M 7/538 |
| 2017/0331525 | A1 * | 11/2017 | Sass | B60L 1/00 |
| 2018/0005788 | A1 * | 1/2018 | Pullmann | H01H 47/22 |
| 2018/0241298 | A1 * | 8/2018 | Reinisch | H02M 3/156 |
| 2019/0260229 | A1 * | 8/2019 | Hayes | H02J 9/066 |
| 2021/0091703 | A1 * | 3/2021 | Combes | H02P 23/03 |
| 2022/0123544 | A1 * | 4/2022 | Shen | H02H 3/087 |
| 2024/0247954 | A1 * | 7/2024 | Lawton | F02D 41/345 |
| 2025/0080088 | A1 * | 3/2025 | Puthumana | H01F 7/064 |

FOREIGN PATENT DOCUMENTS

| | | | | | |
|---|---|---|---|---|---|
| DE | 102007046488 | A1 * | 4/2009 | | H03K 5/2472 |
| EP | 2983187 | A2 * | 2/2016 | | H01H 3/001 |
| GB | 2306679 | A * | 5/1997 | | B60T 8/36 |
| WO | WO-9705637 | A1 * | 2/1997 | | H03K 17/0822 |
| WO | WO-2013087604 | A1 * | 6/2013 | | G01R 31/006 |

OTHER PUBLICATIONS

"High-voltage contactor control", David Dong, 2020, 16 pages, retrieved from https://www.ti.com/lit/ml/slyp693/slyp693.pdf?ts= 1678105349002&ref_url=https%253A%252F%252Fwww.google. com%252F.

"IC-JE PWM Relay/Solenoid Driver", iC Haus, 2015, 11 pages, retrieved from https://www.ichaus.de/upload/pdf/JE_datasheet_G3en. pdf.

"IC-GE PWM Relay/Solenoid Driver", iC Haus, 2014, 14 pages, retrieved from https://www.ichaus.de/upload/pdf/GE_datasheet_ B1en.pdf.

"Detection of Plunger Movement in DC Solenoids", Manu Balakrishnan et al., Jun. 2015, 10 pages, retrieved from https://www.ti.com/lit/ wp/ssiy001/ssiy001.pdf?ts=1684924738635.

* cited by examiner

Figure 2B (PRIOR ART)

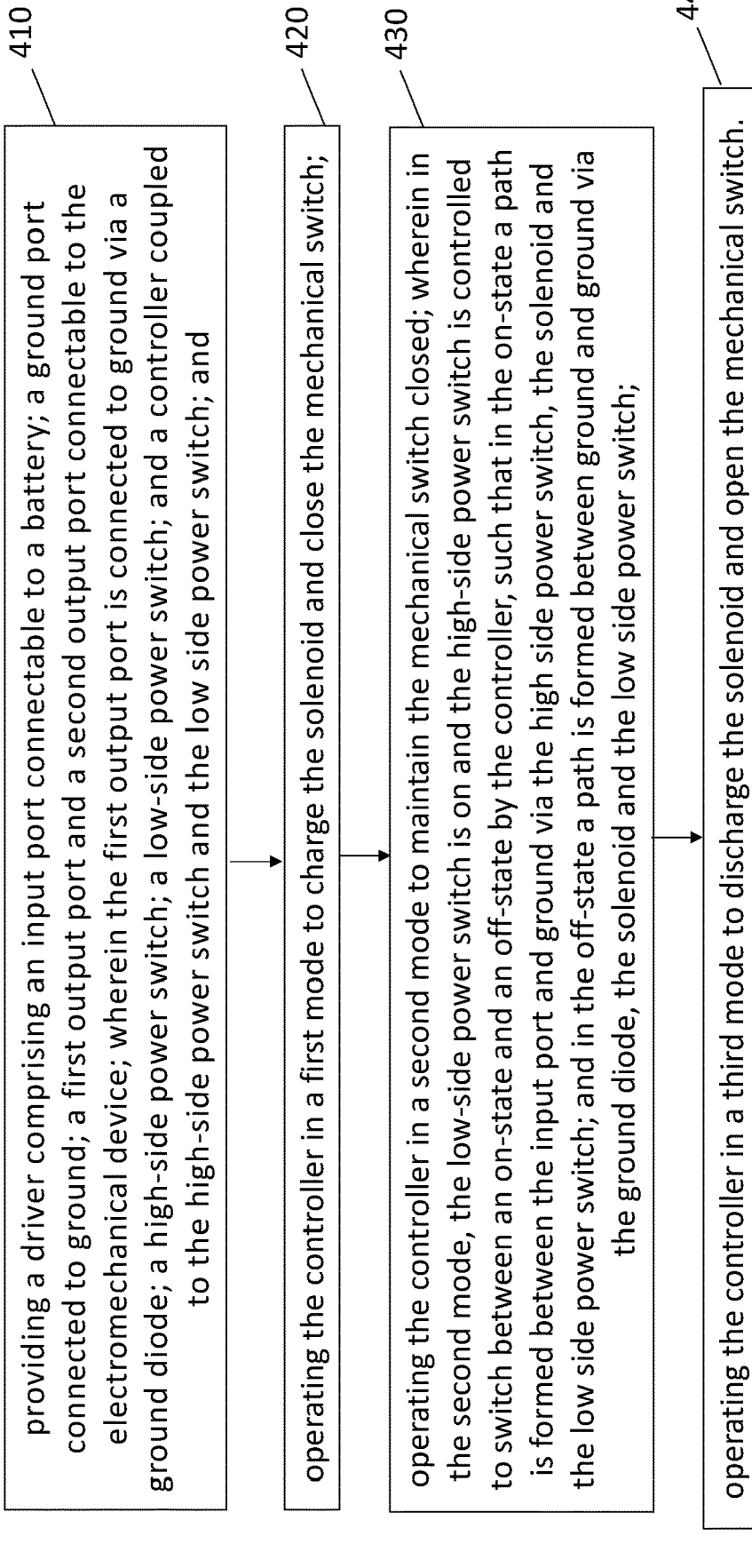

410 providing a driver comprising an input port connectable to a battery; a ground port connected to ground; a first output port and a second output port connectable to the electromechanical device; wherein the first output port is connected to ground via a ground diode; a high-side power switch; a low-side power switch; and a controller coupled to the high-side power switch and the low side power switch; and

420 operating the controller in a first mode to charge the solenoid and close the mechanical switch;

430 operating the controller in a second mode to maintain the mechanical switch closed; wherein in the second mode, the low-side power switch is on and the high-side power switch is controlled to switch between an on-state and an off-state by the controller, such that in the on-state a path is formed between the input port and ground via the high side power switch, the solenoid and the low side power switch; and in the off-state a path is formed between ground and ground via the ground diode, the solenoid and the low side power switch;

440 operating the controller in a third mode to discharge the solenoid and open the mechanical switch.

HSD on, Fully Enhanced
LSD on, Fully Enhanced
V(contactor) = VBAT − I*R$_{HSD}$ − I*R$_{LSD}$ OFF Clamping ON, Linear

60V

HSD off
LSD on, in Linear Region clamping to 60V
$V(contactor) = V_{D\_FW} + V_{clamp}$

DRIVER FOR DRIVING AN ELECTROMECHANICAL DEVICE

TECHNICAL FIELD

The present disclosure relates to a driver for driving an electromechanical device. In particular the disclosure relates to a driver for driving a high-voltage contactor device.

BACKGROUND

Contactor devices comprise of two contacting surfaces which are opened and closed to switch an electrical circuit on or off. They are used in high voltage and high current load applications such as controlling large motors (for example, motor vehicles). Typically, the contactor is opened and closed through the use of an actuator such as a solenoid which comprises a plunger attached to the first surface of the contactor through a spring. This plunger is located within a coil of conducting material.

The solenoid is coupled to a driving circuit which will apply a current through the coil of the solenoid resulting in electromagnetic induction. The magnetic force exerted on the plunger moves the contacting surfaces from an open to a closed position. To open the contactor again, the coil of the solenoid needs to be de-energised in order to reduce the magnetic force being applied to the plunger. The de-energisation process needs to happen quickly in the interest of both safety and preservation of equipment. If the de-energisation is not fast enough, the contacting surfaces will be damaged and may be welded together resulting in an inability to switch off the high voltage creating a dangerous condition.

Traditionally, for circuits that use a solenoid, the coil is discharged through a freewheel path in the circuit. This solution has been favoured due to its simplistic design, however for high-voltage uses of a contactor the freewheel path is unfavourable as current will still flow through the coil of the solenoid slowing the de-energisation process which can weld the contactors together. An alternative solution that has been frequently used is to implement the freewheel path with a voltage clamping circuit which will discharge the coil once a threshold voltage has been reached. Such solutions can be seen in the Gigavec Applications Note AN-016 titled "Driving Contactors with external PWM" (https://www.sensata.com/sites/default/files/a/Sensata-gigavac-driving-contactors-with-external-pwm-app-note.pdf), the Texas Instruments technical material titled 'high-voltage contactor control' presentation by David Dong (https://www.ti.com/lit/ml/slyp693/slyp693.pdf?ts=167810534 9002&ref_url=https%253A%252F%252Fwww. google.com%252F) and the iC-Haus datasheets for their iC-JE and iC-GE PWM relay/solenoid drivers (https://www.ichaus.de/upload/pdf/JE_datasheet_G3en.pdf https://www.ichaus.de/upload/pdf/GE_datasheet_B1en.pdf).

Clamping circuits are typically implemented with low clamping voltage, making them unsuitable for high-voltage contactors, further they often require the use of multiple power devices which results in an increased area for the driving circuit as well increased production costs.

It is an object of the disclosure to address one or more of the above mentioned limitations.

SUMMARY

According to a first aspect of the disclosure, there is provided a driver for driving an electromechanical device comprising a solenoid and a mechanical switch; the driver comprising: an input port connectable to a battery; a ground port connected to ground; a first output port and a second output port connectable to the electromechanical device; wherein the first output port is connected to ground via a ground diode; a high-side power switch;

a low-side power switch; and a controller coupled to the high-side power switch and the low side power switch; the controller being operable in a first mode to charge the solenoid and close the mechanical switch, a second mode to maintain the mechanical switch closed, and a third mode to discharge the solenoid and open the mechanical switch; wherein in the first mode and the second mode, the low-side power switch is on and the high-side power switch is controlled to switch between an on-state and an off-state by the controller, such that in the on-state a path is formed between the input port and ground via the high side power switch, the solenoid and the low side power switch; and in the off-state a path is formed between ground and ground via the ground diode, the solenoid and the low side power switch.

Optionally, wherein the first mode comprises a first phase during which the low-side power switch and the high side power switch are both on until a target current is reached through the solenoid, and a second phase during which the high-side power switch switches between the on-state and the off-state to maintain the target current through the solenoid.

Optionally, wherein the second mode comprises a first phase during which the controller operates in the off state to drop the current through the solenoid to a second target value, and a second phase during which the high-side power switch switches between the on-state and the off-state to maintain to maintain the current through the solenoid at the second target value.

Optionally, during the third mode the solenoid is discharged through the low-side power switch controlled by a zener trigger.

For instance, in the third mode the solenoid is fully discharged to open the mechanical switch.

Optionally, a clamping trigger path is provided parallel to the low-side power switch, the clamping trigger path comprising a diode, a Zener diode and a resistor.

Optionally, the driver is a contactor driver for driving a contactor.

Optionally, the driver further comprises a multiplexer.

Optionally, the driver further comprises a digital circuit. For instance the digital circuit or digital core may be implemented as a state machine.

Optionally, wherein the digital circuit is adapted to measure a feedback current and update the controller according to the value of the feedback current. For instance the feedback current may be a current through the solenoid.

Optionally, wherein the high-side power switch and the low side power switches have different voltage ratings. For instance the high side power switch may have a voltage rating of 45V, and the low side power switch may have a voltage rating of 65V.

Optionally, the high side power switch has a voltage rating defined by a battery voltage provided at the input port.

Optionally, the low-side power switch has a voltage rating defined by a clamping voltage of the clamping path.

Optionally, the controller is configured to perform pulse width modulation.

Optionally, the mechanical switch comprises a static contact member and a movable contact member.

According to a second aspect of the disclosure, there is provided an electromechanical system comprising an electromechanical device coupled to the driver of the first aspect.

According to a third aspect of the disclosure, there is provided a method for driving an electromechanical device comprising a solenoid and a mechanical switch; the method comprising:

provided a driver comprising an input port connectable to a battery; a ground port connected to ground; a first output port and a second output port connectable to the electromechanical device; wherein the first output port is connected to ground via a ground diode; a high-side power switch; a low-side power switch; and a controller coupled to the high-side power switch and the low side power switch;

operating the controller in a first mode to charge the solenoid and close the mechanical switch;

operating the controller in a second mode to maintain the mechanical switch closed; wherein in the first mode and the second mode, the low-side power switch is on and the high-side power switch is controlled to switch between an on-state and an off-state by the controller, such that in the on-state a path is formed between the input port and ground via the high side power switch, the solenoid and the low side power switch; and in the off-state a path is formed between ground and ground via the ground diode, the solenoid and the low side power switch;

operating the controller in a third mode to discharge the solenoid and open the mechanical switch.

Optionally, wherein the second mode comprises a first phase during which the controller operates in the off state to drop the current through the solenoid to a second target value, and a second phase during which the controller operates to maintain the current through the solenoid at the second target value.

The options described with respect to the first aspect of the disclosure are also common to the second and third aspects of the disclosure.

DESCRIPTION OF THE DRAWINGS

The disclosure is described in further detail below by way of example and with reference to the accompanying drawings, in which:

FIG. 2B is a diagram illustrating operation of the driver of FIG. 1 in an off freewheeling phase;

FIG. 4 is a flow chart for a method for driving an electromechanical device according to the present disclosure;

DESCRIPTION

Figure 1A:
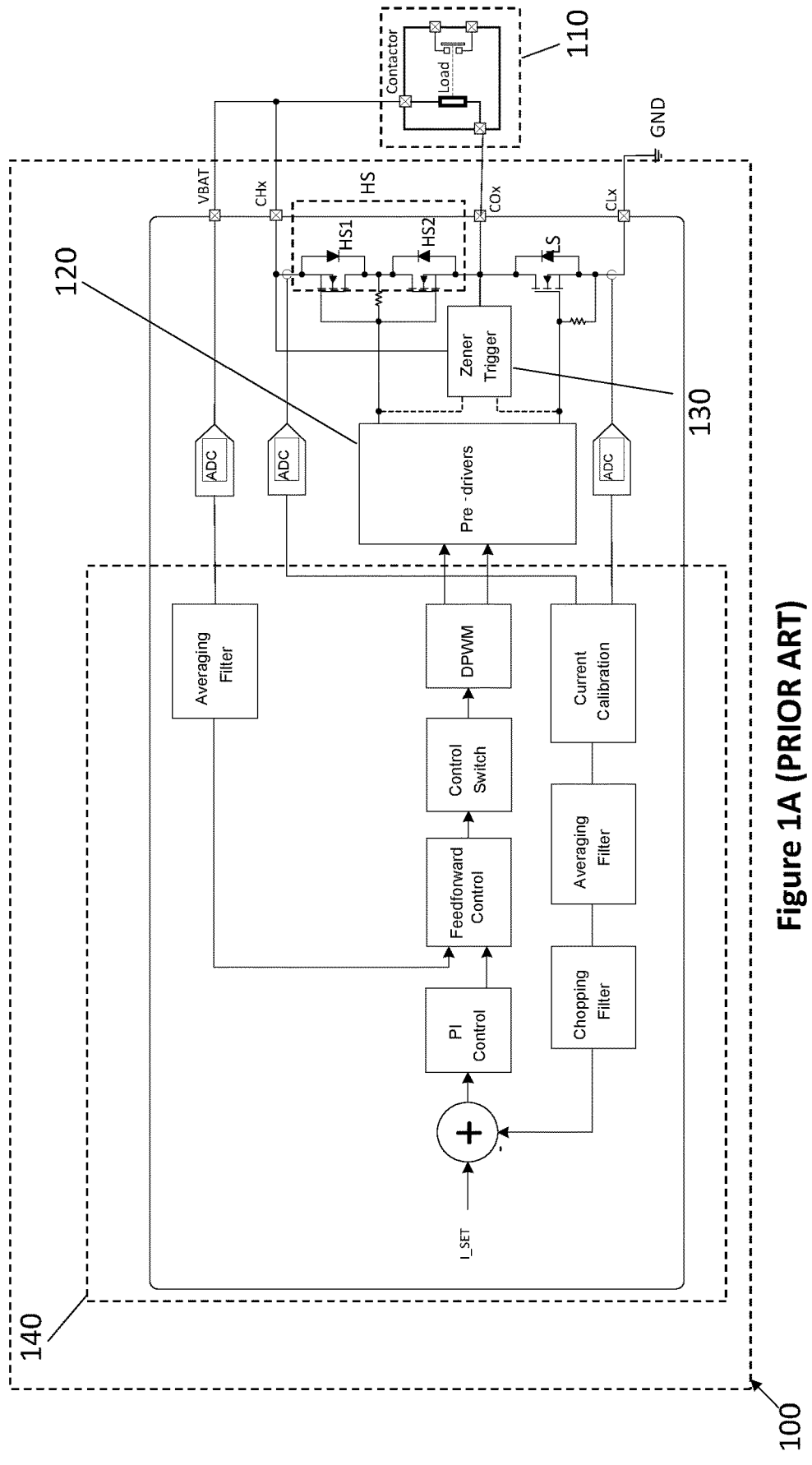
FIG. 1A is a driver for driving a contactor according to the prior art.

FIG. 1A illustrates a driver for driving an electromechanical device such as a contactor according to the prior art. The driver 100 is coupled to a contactor 110 which comprises a solenoid (load) and a mechanical switch. The driver is adapted to drive the solenoid to actuate the mechanical switch. The driver 100 has an input port connected to a battery having a voltage VBAT; a ground port (CLx) connected to ground; and two output ports labelled CHx and Cox connected to the solenoid of the contactor. The first output port CHx is connected to both the battery and the solenoid.

The driver 100 comprises a digital core 140 coupled to a controller 120 which controls the high-side HS power switches HS1 and HS2 and the low-side power switch LS, implemented as field effect transistors (FETs). A Zener trigger 130 is coupled between the high-side and low-side of the driver. The zener tigger turns on the driver in a linear mode to provide the clamping.

The driver 100 is a high-voltage contactor driver that employs both a high-voltage clamp and a free-wheel path. The high-voltage clamp is implemented with the Zener trigger 130 which comprises a Zener diode which will only allow current to flow through the clamping path once the voltage at the Zener diode has reached a threshold voltage. In prior implementations of similar drivers to the one presented in FIG. 1A, the clamping was limited to less than 50V but for high-voltage contactor cases (for example, automotive contactors) a clamping of up to 60V is required. The driver 100 in FIG. 1A can be implemented with a clamp of 60V. The freewheel path for the driver 100 in this embodiment is a switchable freewheel path on the HS of the driver.

In this topology, the driver is implemented such that HS1, HS2 and LS are controlled by the controller 120 implemented as a pulse width modulation PWM controller. The PWM controller 120 is operated via the digital core 140 which is adapted to detect the feedback current on both the LS and HS of the driver 100. The value of the feedback current on the LS and HS of the driver 100 dictates the signal the PWM controller 120 sends to the switches. This specific topology works in three modes.

Figure 1B:
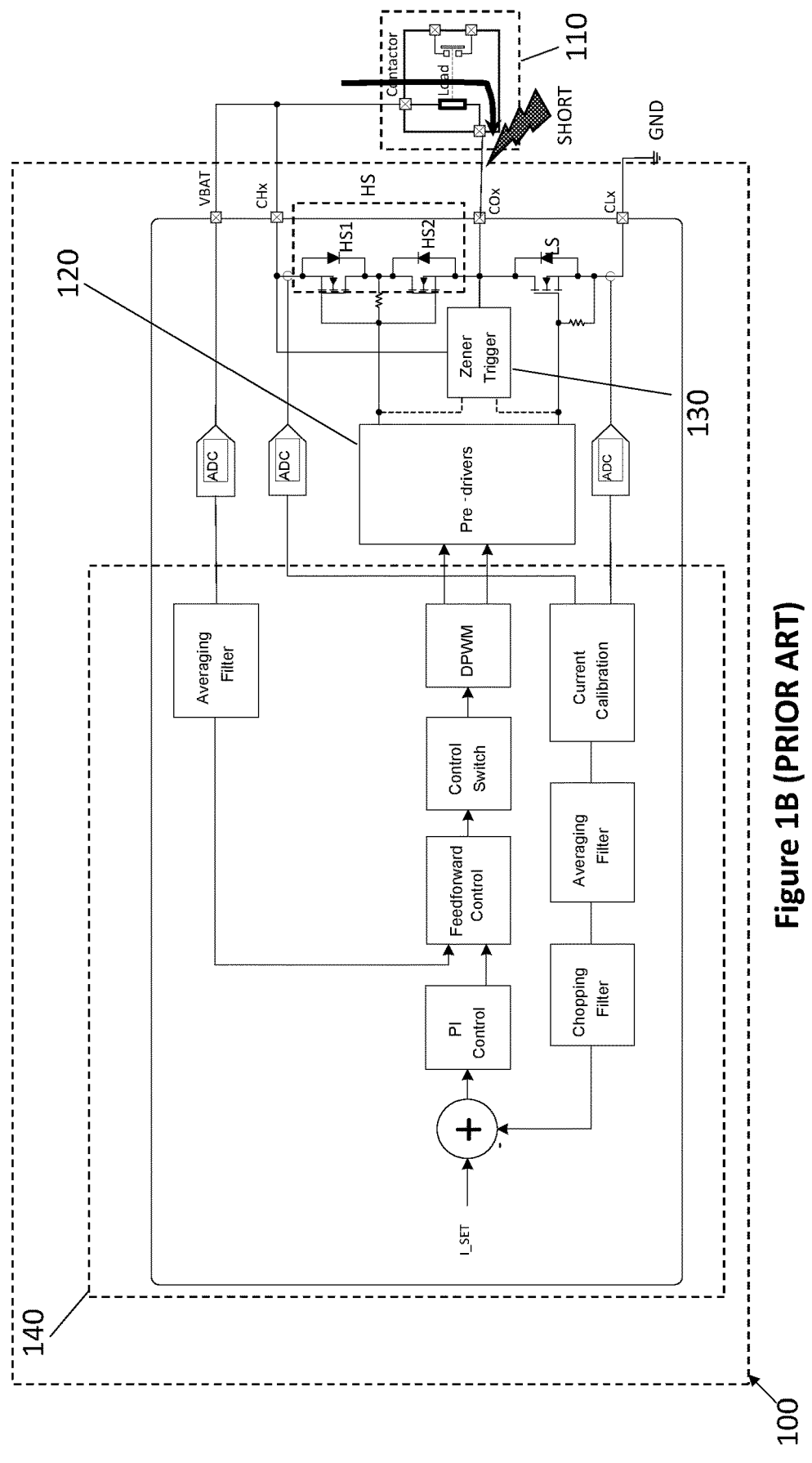
FIG. 1B is a diagram of the circuit of FIG. 1A showing a ground short connection.
Figure 2A:
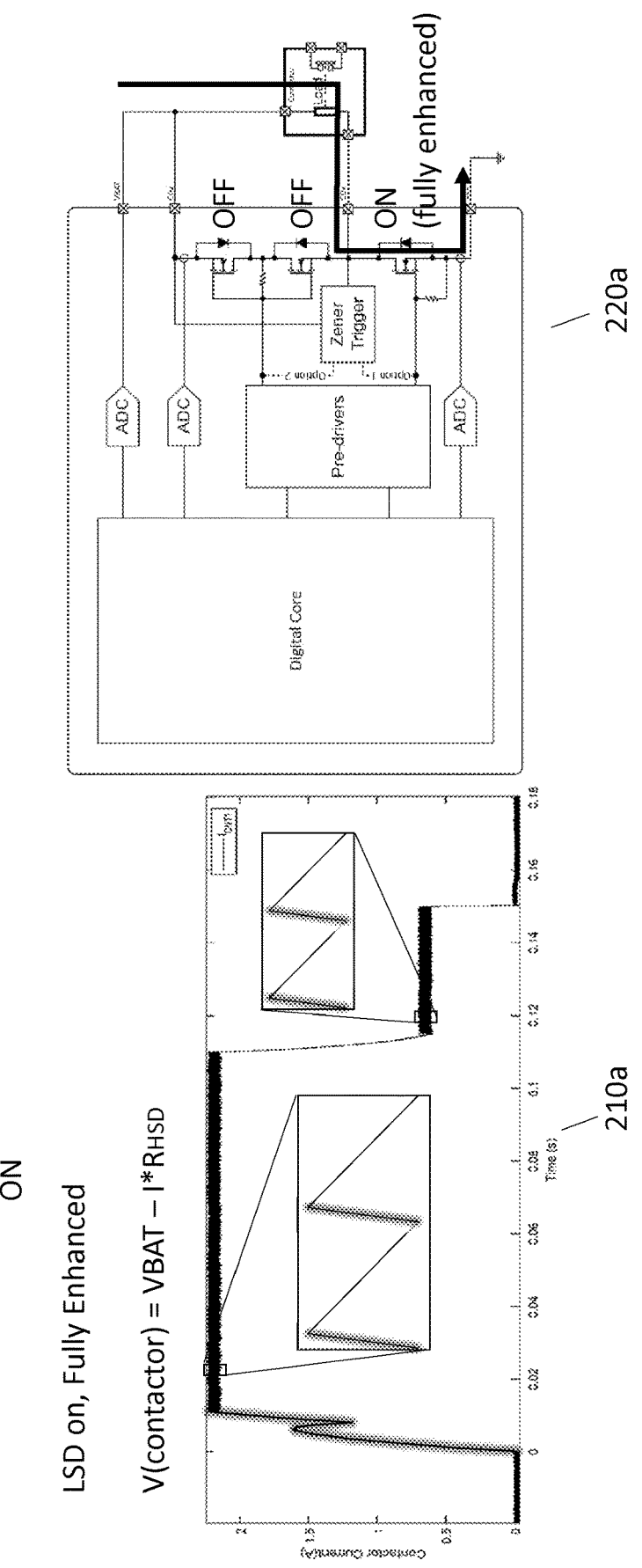
FIG. 2A is a diagram illustrating operation of the driver of FIG. 1 in an on-phase.
Figure 2B:
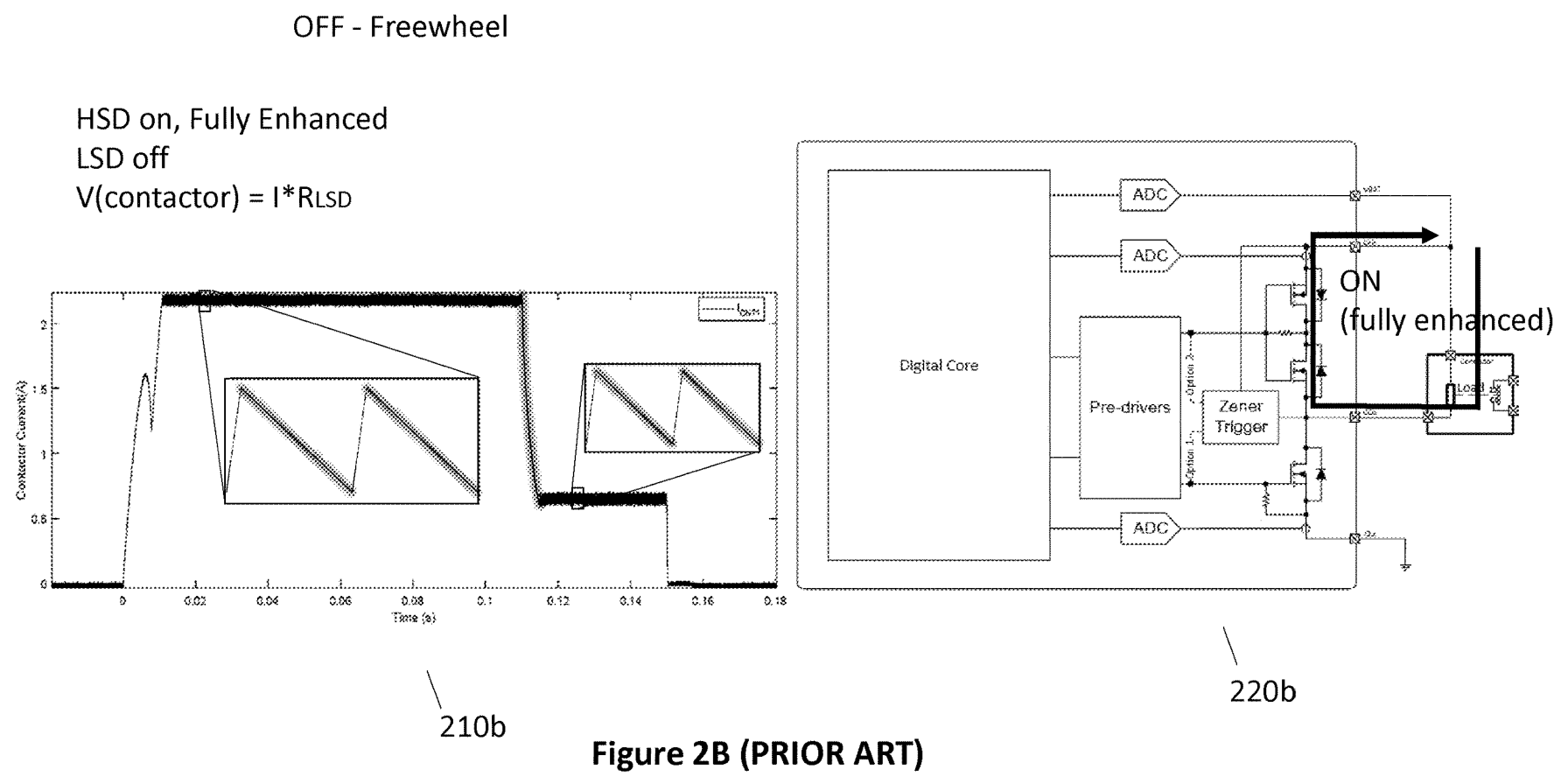
Figure 2C:
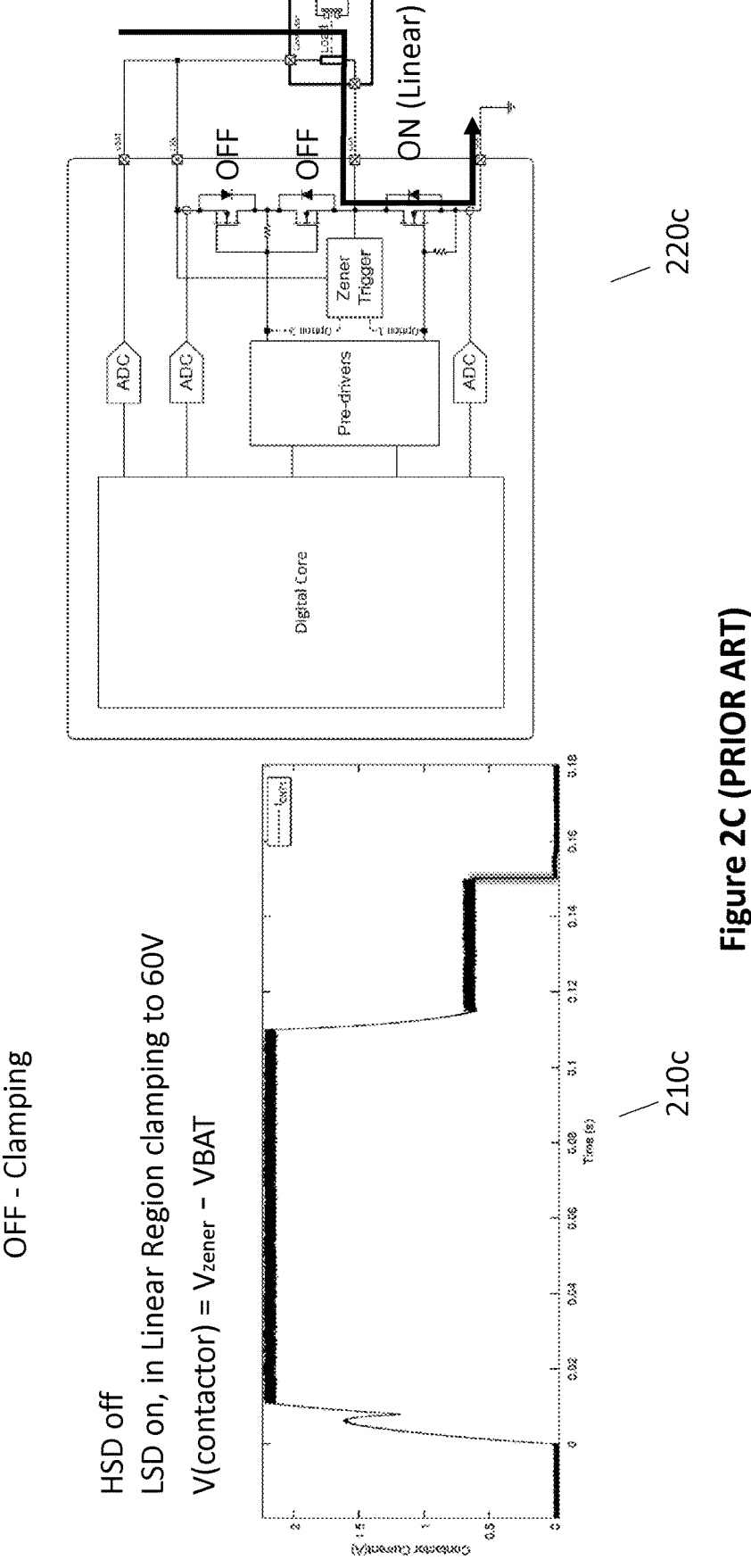
FIG. 2C is a diagram illustrating operation of the driver of FIG. 1 in an off clamping phase.

FIGS. 2A, 2B and 2C are diagrams illustrating the operation of the circuit of FIG. 1. The driver 100 operates in three phases referred to as on phase, off freewheeling phase, and off clamping phase. The panels 210a,b,c show the current through the load as a function of time for each phase and the panels 220a,b,c show the current path through the driver 100 and electromechanical device 110 in each phase.

In the first phase, shown in FIG. 2A, a current path is formed from the battery port with voltage VBAT to ground GND via the electromechanical device 110 and the LS power switch. Initially when the driver is turned on, the LS switch is on and the switches HS1 and HS2 are off. As the current through the solenoid builds up, the digital core 140 will continue to monitor its value. Once the current sur- passes a threshold value, the digital core 140 will alert the controller 120 at which point both the HS and LS switches are both controlled through PWM. The point in time when PWM control takes over coincides with the end of a steep increase in current on the current-time plot in row 210a. After this point the driver 100 then switches back and forth between the first two phases: On Phase and Off Freewheel- ing phase. During the Off Freewheeling phase as shown in FIG. 2B, the PWM control 120 turns LS switch off and the HS1 and HS2 switches on. In this phase, the switchable freewheel path is on and the current flows in a circular path that includes the HS1, HS2 and the electromechanical device 110. The HS freewheel path allows for current to be maintained within the load whilst LS is off. The On-Phase and Off Freewheeling phase can be considered as a single phase of operation of the driver 100 which acts to close the contactor and shall be referred to from now on as Turn-On.

After the contactor has closed, it needs to be opened immediately when turned off and the driver 100 enters the second phase of operation, Turn-Off shown in FIG. 2C. At the start of this phase, both the HS and LS switches are off and the voltage builds at the Zener trigger 130 until it surpasses a threshold value (in this example, the threshold voltage is 60V), at which point the Zener diode begins to conduct and the clamping path is opened to allow for the discharge of the load. This is when the driver 100 enters the third phase: Off Clamping. Once the clamping path is open, the LS switch is turned on and begins operating in linear mode, the output of the circuit is clamped above the battery to $V_{DZ}$, where $V_{DZ}$ is the threshold voltage of the Zener diode. This clamp allows for de-energization of the load and the contactor opens. The purpose of switches HS1 and HS2 in the driver 100 presented in FIGS. 1 and 2 is to block the freewheel path during clamping to prevent the current from taking the path of least resistance which would result in a slow de-energization of the load which could damage the contactors by welding them together which in turn could trigger a safety hazard. Therefore, the driver 100 requires three power switches to operate, two of which are coupled in series to each other, which increases the area occupied on a circuit chip and thus increasing manufacturing costs.

The topology presented in FIG. 1A has the drawback that in the case of a short-to-ground, as shown in FIG. 1B, on the low-side of the driver 100, the electromechanical device 110 will still be activated since the first output port CHx is directly connected to the battery. Therefore, the contactor will close when it is not meant to, which presents a safety concern.

Figure 3:
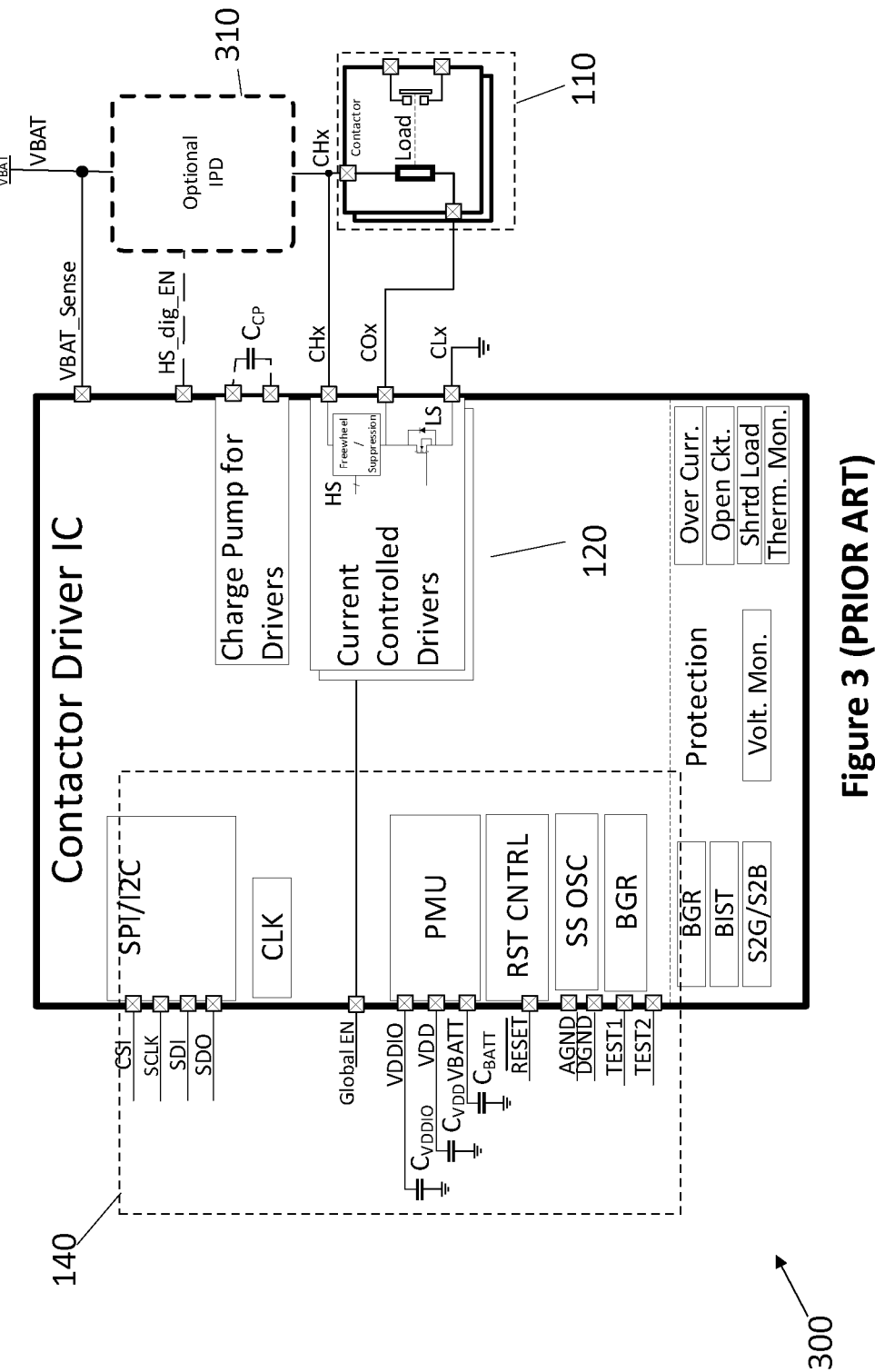
FIG. 3 is diagram of an alternative embodiment of the driver from of FIG. 1.

FIG. 3 shows a modified version of the driver of FIG. 1A. The driver 300 is nearly identical to the one presented in FIG. 1 and as such the same labels have been kept to indicate the same components. In this case an additional power switch 310 is coupled between the battery port and the first output port CHx to improve the safety of the system. The power switch 310 will switch off the voltage supply from Vbat to CHx in the event of a short-to-ground on the low-side of the driver 100.

The addition of yet another power switch in the driver 100 further increases the area occupied on a circuit chip. Fur- thermore, all of the power switches (HS1, HS2, LS and 310) must be able to sustain a high voltage. During the Off (Clamping) phase the voltage clamp occurs relative to battery to ground path. As such all power switches need to be able to sustain the battery voltage VBAT plus the clamp- ing voltage. In the example of a high-voltage contactor case, the clamping voltage required is 60V and the minimum required battery voltage is 18V, hence the power switches need to have a voltage rating of at least 80V. This high voltage rating further increases the area occupied by the circuit. The addition of power switch 310 to improve safety of the driver, increases costs of manufacturing.

The present disclosure seeks to address the issues of area occupied on a chip, the cost of manufacturing and safety hazard concerns whilst also providing a driver which can de-energize the solenoid quickly to prevent damage to the contactor.

FIG. 4 is a flow chart of a method for driving an electromechanical device according to the disclosure. The electrochemical device includes a solenoid coupled to a mechanical switch.

At step 410 a driver is provided. The driver comprises an input port connectable to a battery; a ground port connected to ground; a first output port and a second output port connectable to the electromechanical device. The first output port is connected to ground via a ground diode. The driver further includes a high-side power switch; a low-side power switch and a controller coupled to the high-side power switch and the low side power switch.

At step 420 the controller is operated in a first mode to charge the solenoid and close the mechanical switch.

At step 430 the controller is operated in a second mode to maintain the mechanical switch closed. In the first mode and the second mode, the low-side power switch is on and the high-side power switch is controlled to switch between an on-state and an off-state by the controller. In the on-state a path is formed between the input port and ground via the high side power switch, the solenoid and the low side power switch. In the off-state a path is formed between ground and ground via the ground diode, the solenoid and the low side power switch. The off state may be described as an off- freewheeling state in which a low impedance path is formed between ground and ground.

At step 440 the controller is operated in a third mode to discharge the solenoid and open the mechanical switch.

Using this approach, the solenoid can be quickly demag- netized thus ensuring fast contact opening of the mechanical switch. This extends the lifetime of the contacts.

Figure 5A:
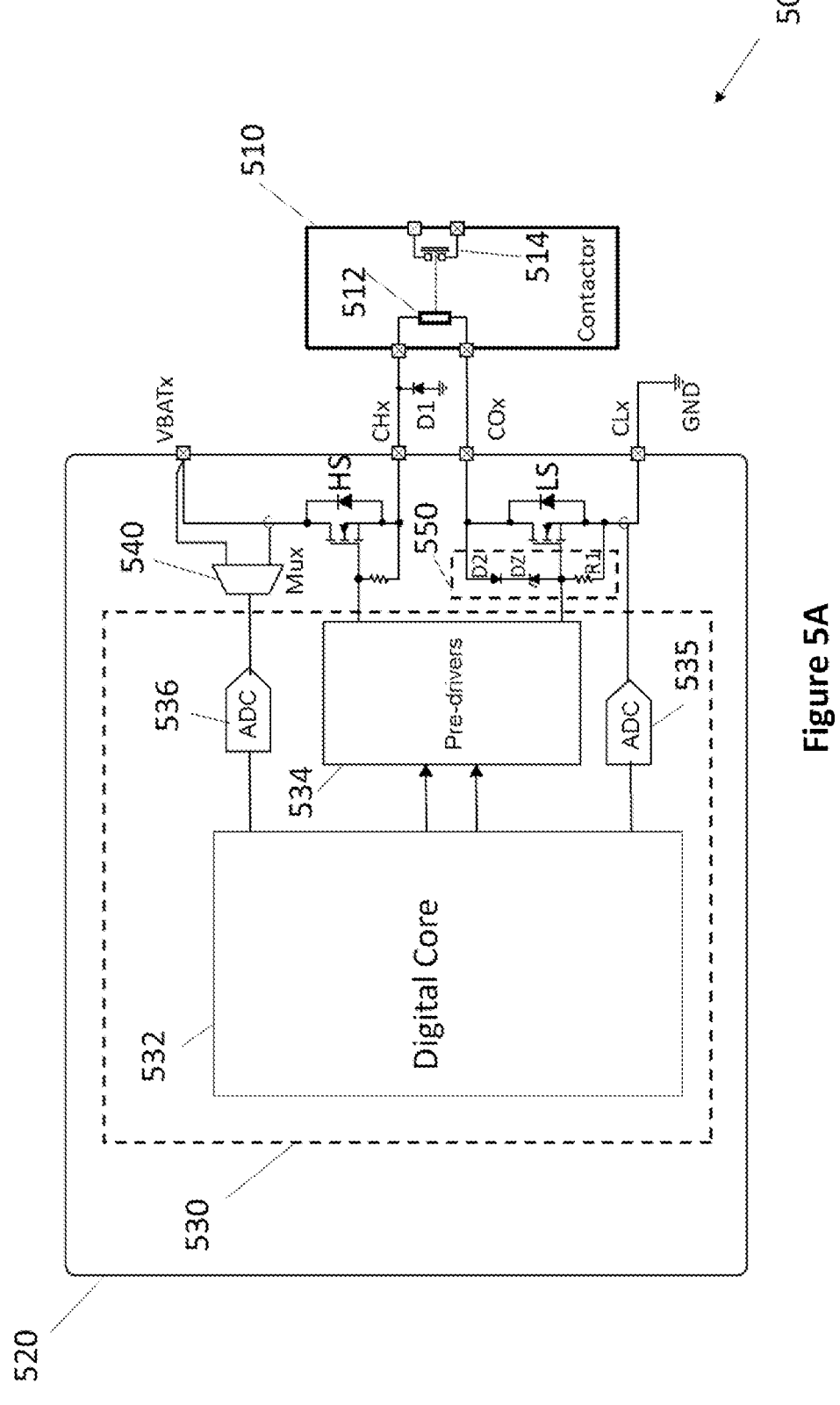
FIG. 5A is a driver for implementing the method of FIG. 4.

FIG. 5A shows an electromechanical system comprising a driver for implementing the method of FIG. 4.

The electromechanical system 500 includes a driver 520 coupled to an electromechanical device 510, such as a contactor for driving the electromechanical device. The electrochemical device has a solenoid 512 coupled to and a mechanical switch 514. The driver 520 includes a high-side power switch HS; a low-side power switch LS; and a controller 530 coupled to the high-side power switch and the low-side power switch. The driver 520 has several ports that include an input port VBATx connectable to a battery (not shown); a ground port CLx connected to ground; a first output port CHx and a second output port COx connectable to the electromechanical device 510. The first output port CHx is connected to ground via a ground diode D1 (which may also be integrated into the device depending on the process technology used).

The controller 530 may include a digital core 532 coupled to a power switch driver 534 for driving the high-side power switch HS and the low-side power switch LS. The digital core 532 may be a state machine that first controls the current to a pull-in threshold, then after the pull-in time expires controls the current to a low hold current level. For instance the digital core may be implemented in the same way as in FIG. 1A. The digital current level output of the state machine is the input to a PI controller that regulated the current using PWM.

The power switches may be implemented in different ways, for instance the power switches may be field effect transistors (FETs). In this implementation, a clamping trigger path 550 is provided between the second output port COx and the ground, so that the clamping trigger path 550 and the low side power switch LS are connected in parallel. Although the system 500 may be implemented without the clamping path by adding a diode to VBATx to recirculate the current, the addition of the clamping path is advantageous as it permits a faster discharge of the solenoid.

The clamping trigger path 550 comprises a diode D2, a Zener diode DZ and a resistor R1. In this example topology the clamping only occurs across the low-side of the driver, meaning that the two power switches LS and HS do not need to have the same voltage rating. The high-side power switch HS only needs to support the voltage coming from the battery VBAT and the switch LS needs to have a voltage rating that can support the clamping voltage.

For example, the driver 520 may be implemented to operate a high-voltage contactor. In this case a relative high clamping voltage may be required. In a numerical example the clamping voltage is 60V and the battery voltage is 40V, leading to a voltage ratings of 45V and 65V for the HS and LS switches, respectively. Compared with driver of FIG. 1, the driver presented in FIG. 5 occupies a smaller area and is more cost-effective to manufacture due to the lower voltage ratings of the power switches and the reduction in the number of power switches required to operate the driver safely.

The power switch driver 534 may be a pulse width modulation PWM driver. In this example the PWM driver 534 is operated by the digital core 532 which is adapted to detect a feedback current on low-side power switch via the sensor 535. For instance, the current sensor may be an ADC sensor. The value of the feedback current dictates the signal the PWM controller 530 sends to the HS switch.

Optionally, a multiplexer 540 may be provided. In this example the multiplexer 540 has a first input coupled to the input port VBATx, a second input coupled to the HS power switch, and an output coupled to the digital core 532 via an ADC 536. The multiplexer 540 provides additional area reduction as it allows for measurement of both the VBAT voltage and the high-side current, using one ADC.

The controller 530 operates in three states or modes: a first mode referred to as Pull-in mode to charge the solenoid and close the mechanical switch, a second mode referred to as HOLD mode to maintain the mechanical switch closed, and a third mode referred to as OFF mode to quickly discharge the solenoid to open the mechanical switch.

Figure 5B:
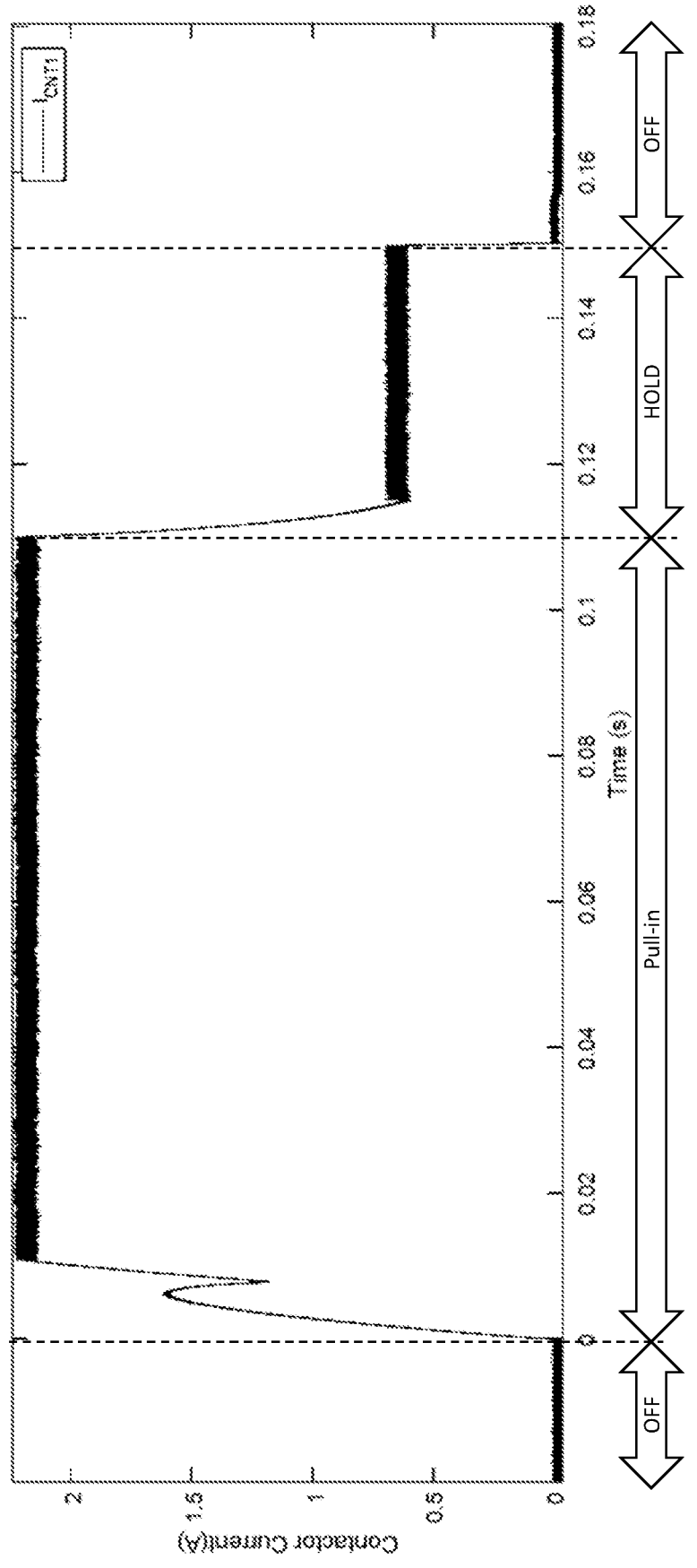
FIG. 5B is a plot showing the current through the solenoid as a function of time.

FIG. 5B is a plot showing the current through the solenoid as a function of time during the first mode (Pull-in mode), the second mode (hold mode) and the third mode (off mode).

The first mode starts when the contactor is first activated, the driver applies the full battery voltage until reaching a pull-in current threshold using the driver control on state, also referred to as on phase. The current is then regulated by PWM to save power, alternately switching between the on state and an off freewheeling state, also referred to as off state or off freewheeling phase. The first mode is maintained for a period of time called the pull-in time to allow the plunger to fully close and after this period the second (hold mode) is entered.

The second mode sets the current level to a lower value to keep the contacts of the mechanical switch closed, while saving power. In this mode the controller regulates the current at a second target level referred to as the hold current level, using PWM control switching between the on state and the off freewheeling state, also simply referred to as off state.

The third mode uses an off clamping state to quickly de-energize the load.

FIG. 6 is a diagram illustrating the operation of the system of FIG. 5. FIG. 6A is a diagram showing a current path in the on state of the first mode (pull-in and hold mode of operation). FIG. 6B shows the current through the solenoid, referred to as contactor current, as a function of time, highlighting the on phases of operation during on states.

The current waveform is labelled with the times t0 to t7. The first (Pull in) mode occurs between the times to and t4. The second (hold) mode takes place between t4 and t6. The third (off) mode occurs twice in this plot from the start to t0, and again from t6 to the end of this plot.

At time to the high side power switch and the low side power switch are both switched on and a current path is created between the input port and ground via HS switch, the solenoid 512, and the LS switch. The current starts to increase generating a force on the plunger. The plunger starts to move at t1 generating a back electromotive force (EMF), reducing the coil current causing the local maximum at time t1. The current continues to decrease as the plunger moves until it is abruptly stopped when the plunger reaches the end of its travel which can be seen as the local minimum at time t2. At this point the mechanical switch is closed and the plunger is fully pull-in. Between the times t2 and t3, the current increases again as the back EMF is no longer present and it will continue until limited by the path resistance, or by reaching a first target current value. The first target current value is a predefined value defined by the characteristic of the contactor to ensure pull-in while avoiding unnecessary power dissipation. The digital core 532 maintains this current level by sending a signal to the power switch driver 534 to drive the HS power switch by PWM.

Figure 6A:
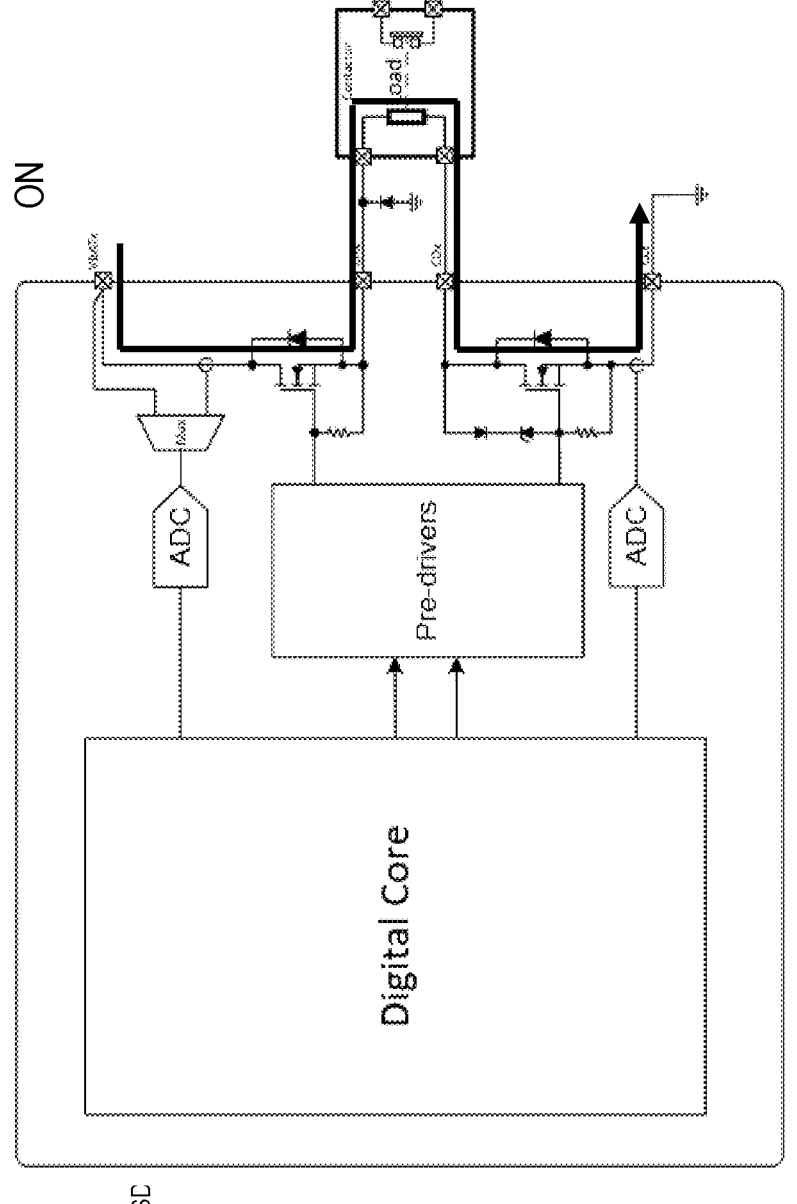
FIG. 6A is a diagram showing a current path in the on phase of operation of the circuit of FIG. 5.
Figure 6B:
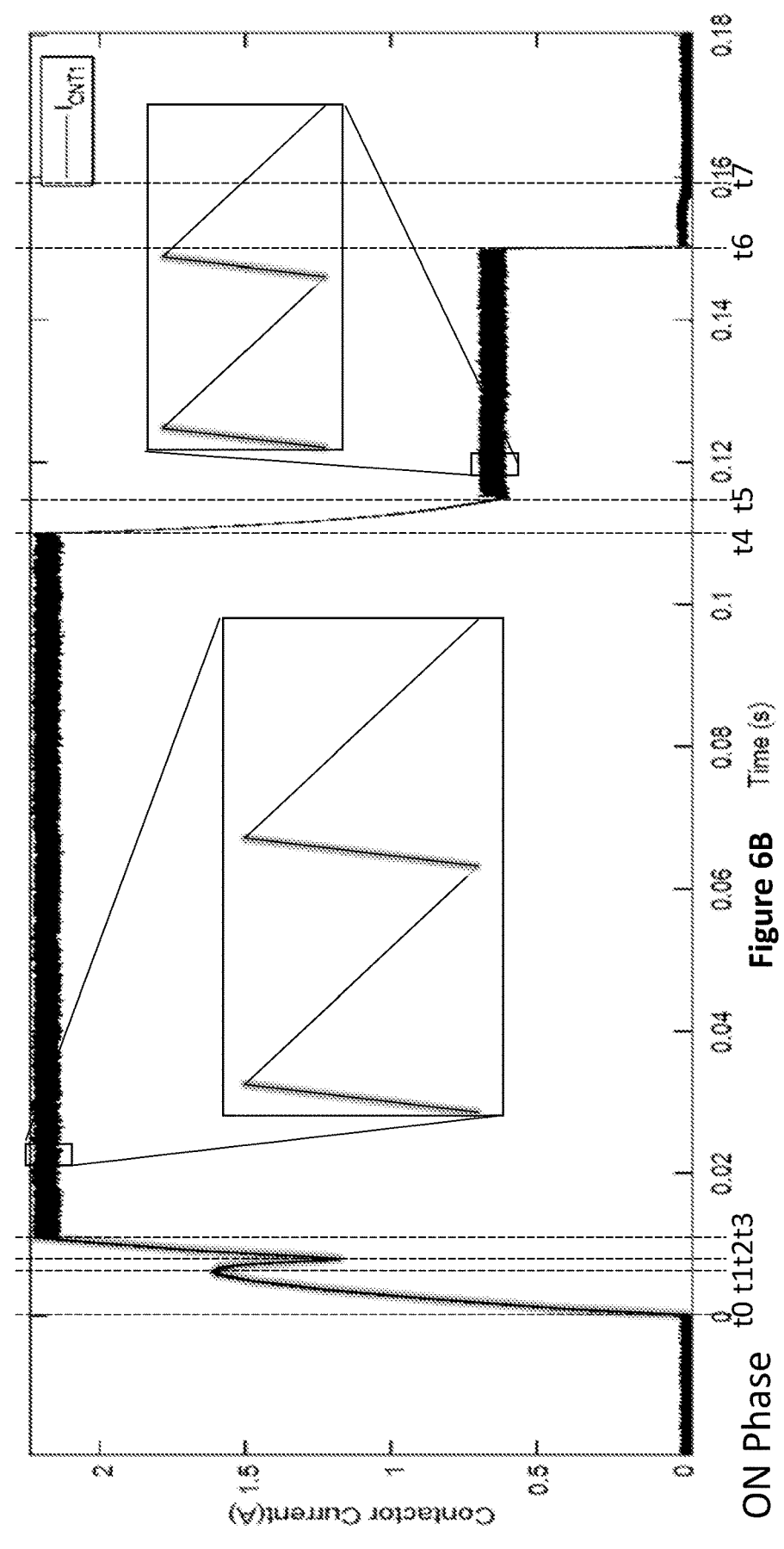
FIG. 6B is a plot showing the current through the solenoid as a function of time, highlighting the on state of operation.
Figure 6C:
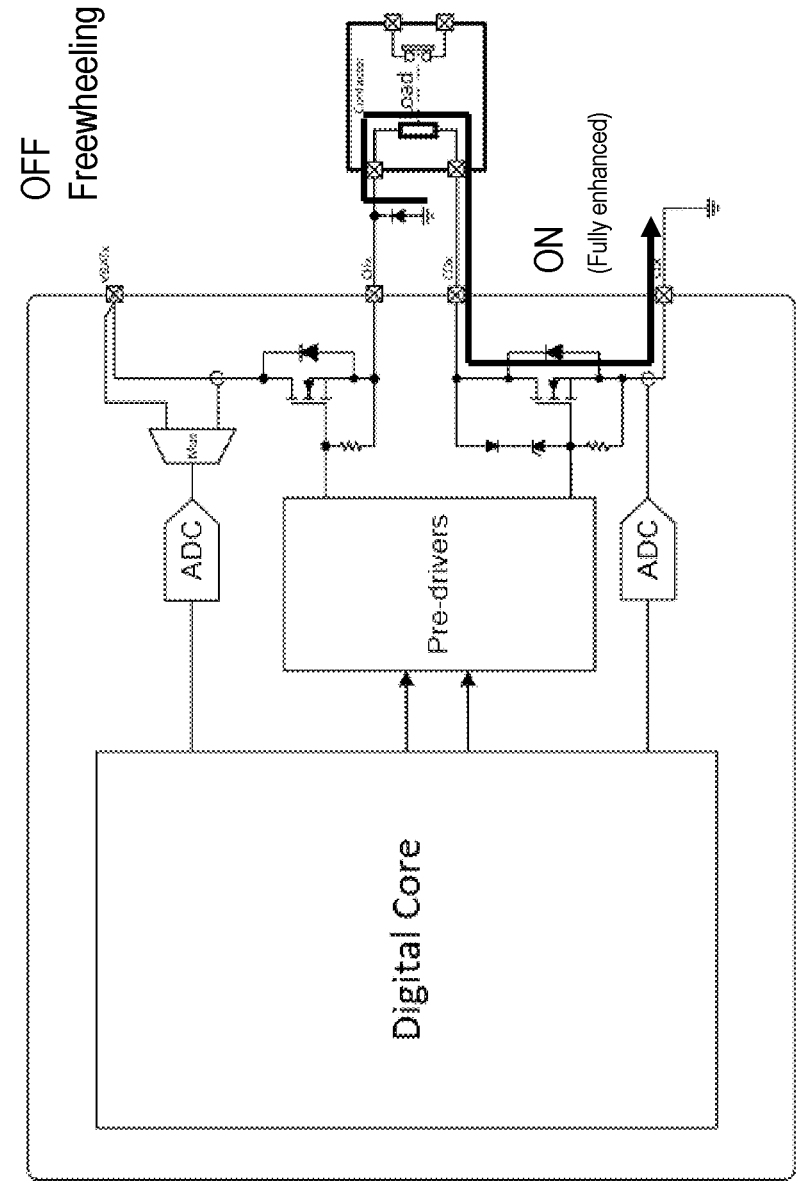
FIG. 6C is a diagram showing a current path in the off freewheeling state of operation of the circuit of FIG. 5.
Figure 6D:
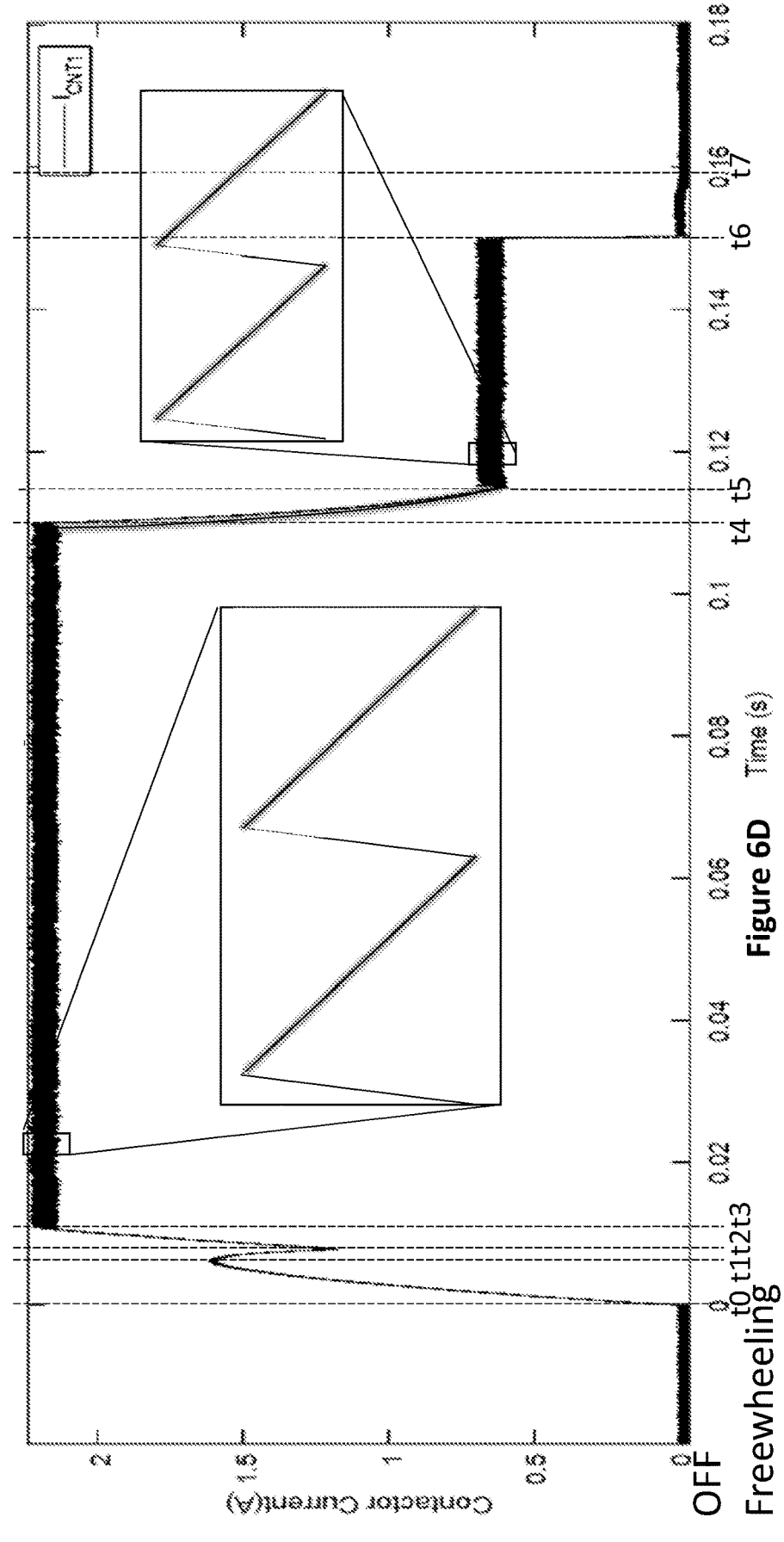
FIG. 6D is a plot showing the current through the solenoid, highlighting the off freewheeling state.

FIG. 6C is a diagram showing a current path in the off freewheeling state of operation. FIG. 6D shows the current through the solenoid, highlighting the off freewheeling state. In the off freewheeling state, a path is formed between ground and ground via the ground diode, the solenoid and the low side power switch.

During the second mode of operation (hold mode) between the times t4 and t6, the controller switches between the on state and the off freewheeling state to maintain the mechanical switch closed. From t4 to t5 the driver is in the off freewheel state and the current slowly decreases from the first target level the second target level also referred to as hold current level. Once reaching the hold current level the current is maintained substantially constant at the second target value. The hold current level may be maintained using a PWM. The second target value may be a pre-defined value, defined by the characteristic of the contactor.

The freewheeling path occurs between the diode-to-ground branch D1 and GND via the solenoid 512 and the low side power switch LS. The path allows for a current to flow through the solenoid (load) but via a path with low resistance.

The presence of the diode D1 means that no additional current is introduced into the circuit path during this mode. The PWM driver 534 switches between the On-Phase/state and Off (Freewheeling) phase/state by switching HS between an on-state and an off-state. The current level in the solenoid (load) is maintained, hence keeping the solenoid energized and the mechanical switch closed.

The electromechanical device 510 then needs to be de-energized quickly in order to open the mechanical switch safely.

The third mode starts at time t6. At time to the controller operates in the off clamping state.

Figure 6E:
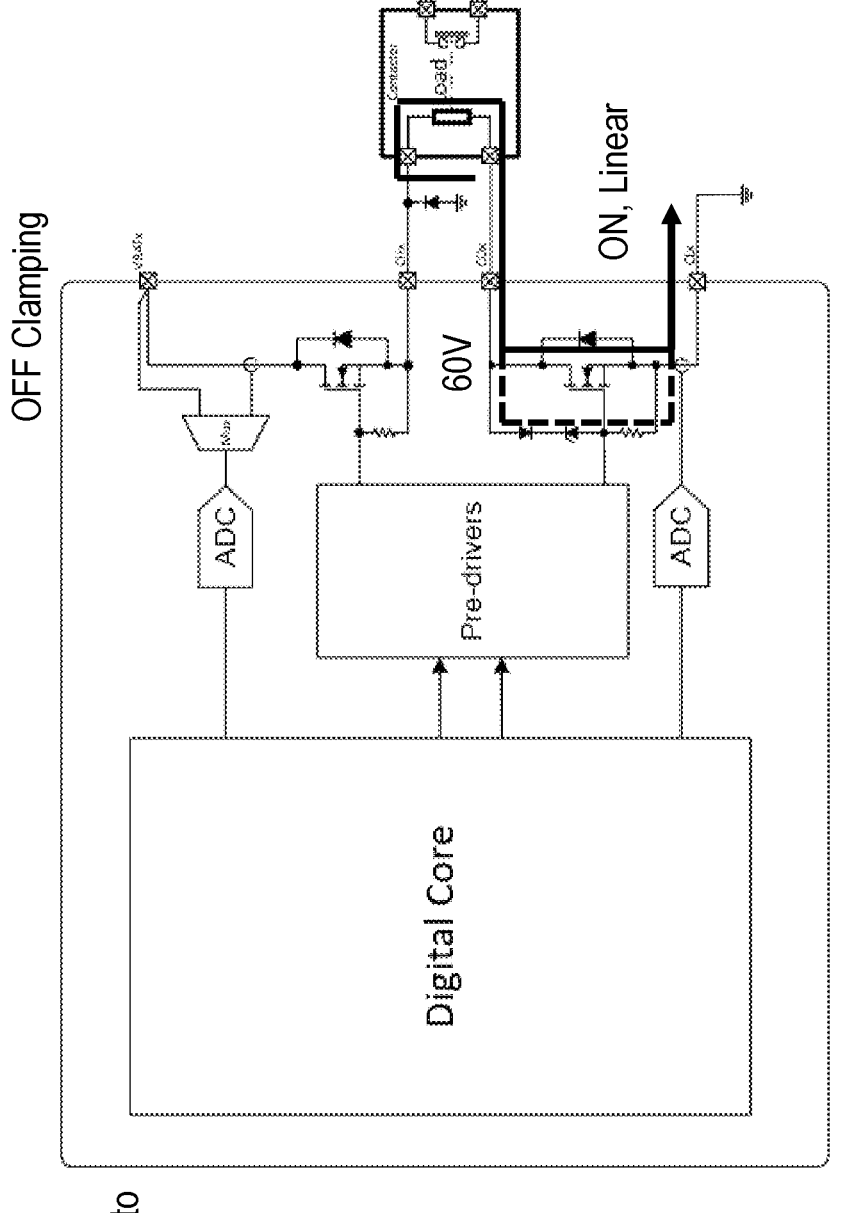
FIG. 6E is a diagram showing a current path in the off clamping state of operation of the circuit of FIG. 5.
Figure 6F:
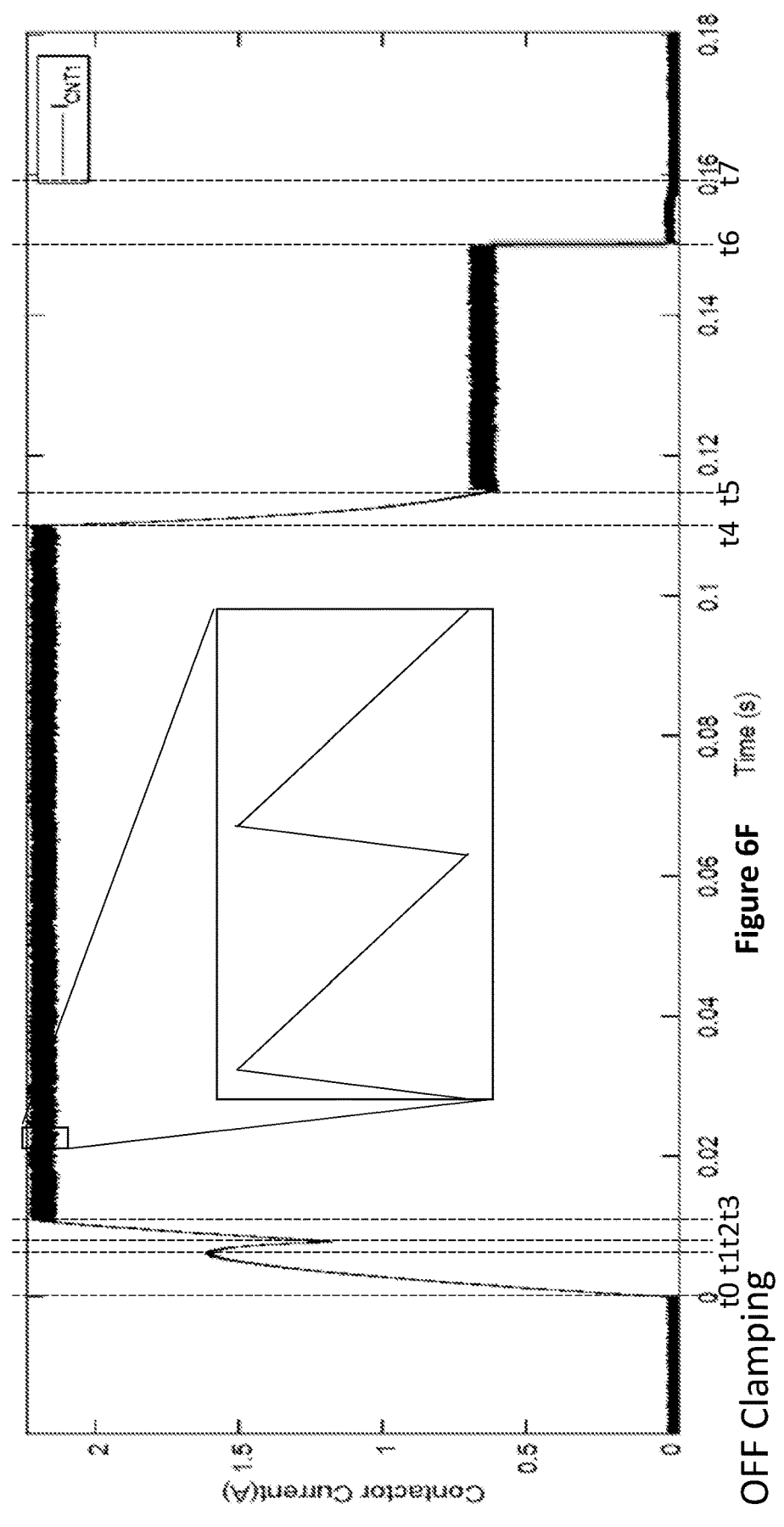
FIG. 6F is a plot showing the current through the solenoid, highlighting the off clamping state.

FIG. 6E is a diagram showing a current path in the off clamping state of operation. FIG. 6F shows the current through the solenoid, highlighting the off clamping state.

A clamping trigger path is formed parallel to the low-side power switch. The clamping trigger path comprises a diode, a Zener diode and a resistor coupled in series. When the voltage reaches the zener clamping trigger threshold the low side driver is activated in linear mode. During the off clamping state, the current through the solenoid decreases much faster than during the off freewheeling state as the two current paths generate much different voltages across the coil.

Initially both the HS power switch and the LS power switch are off and a voltage builds at the Zener diode DZ until it reaches the threshold value for $V_{DZ}$-which in the example of a high-voltage contactor a clamping of 60V is required. Once this threshold is met, the Zener diode DZ begins to conduct building a voltage across the resistor R1, activating the LS transistor in linear mode providing the clamping path to allow for the discharge of the load. The mechanical switch then opens shortly after time t6, around time t7 after the current through the solenoid has reached zero.

In the third mode, off-clamping the energy in the coil is quickly dissipated by the path formed between ground and ground via the ground diode, the solenoid, and the low-side power switch activated in linear mode with a high clamping voltage by the zener trigger. The high voltage clamping quickly demagnetizes the coil ensuring fast contact opening which extends the lifetime of the contacts avoiding the drawbacks of slow demagnetization caused using a free-wheel path or a lower clamping voltage.

The topology presented in FIG. 5 overcomes the short-comings of the topology shown in FIG. 1. In the event of a short-to-ground in the low-side of the driver 520, the digital core 532 will disable both the HS and LS power switches. For driver 520, unlike in the prior art, the only path from the electromechanical device 510 to the battery is via the HS power switch. Therefore, if HS is off then no current can flow through the load and hence the new topology prevents the safety hazards incurred by the design presented in FIG. 1 without the need for an additional power switch.

The topology shown in FIG. 5 and the way it operates (as described above) only requires two power switches (HS and LS). In the topology of FIG. 1, the low-side had a single power switch but the freewheel path was on the high-side of the driver and required two power switch connected in series as the freewheel path in that topology had to be switchable. Connecting two power switches in series increases the area occupied by four times the amount of a single power switch, as can be seen in FIG. 7A.

Figure 7A:
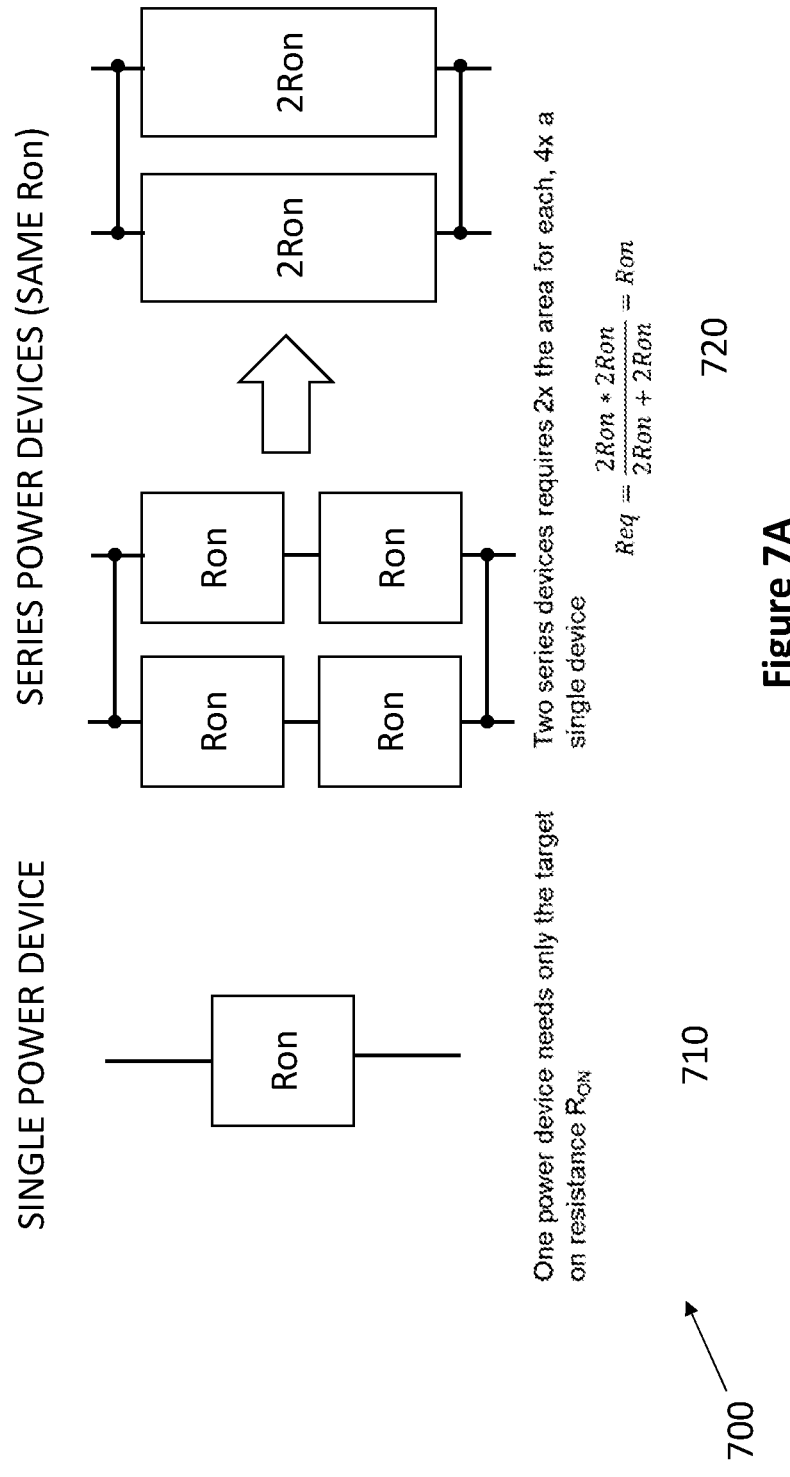
FIG. 7A is a diagram showing the area occupied on a circuit chip by power switches in different configurations.

FIG. 7A shows the area occupied on a circuit chip by power switches in different configurations. The left-hand panel 710 shows the area occupied for a single power switch, the on-resistance target is just Ron. The right-hand panel 720 shows that when two power switches are connected in series, each power switch requires twice the area in order to meet the on-resistance target which equates to an area of four times that of just a single power device.

Furthermore, in the original topology of FIG. 1 each of the power switches needed to be able to sustain both the battery voltage as well as the clamping voltage. For a clamping voltage of 60V and a minimum battery voltage of 18V, this would require each of the power switches having a voltage rating of 80V which also increases the area the power switches would occupy on a circuit chip.

Figure 7B:
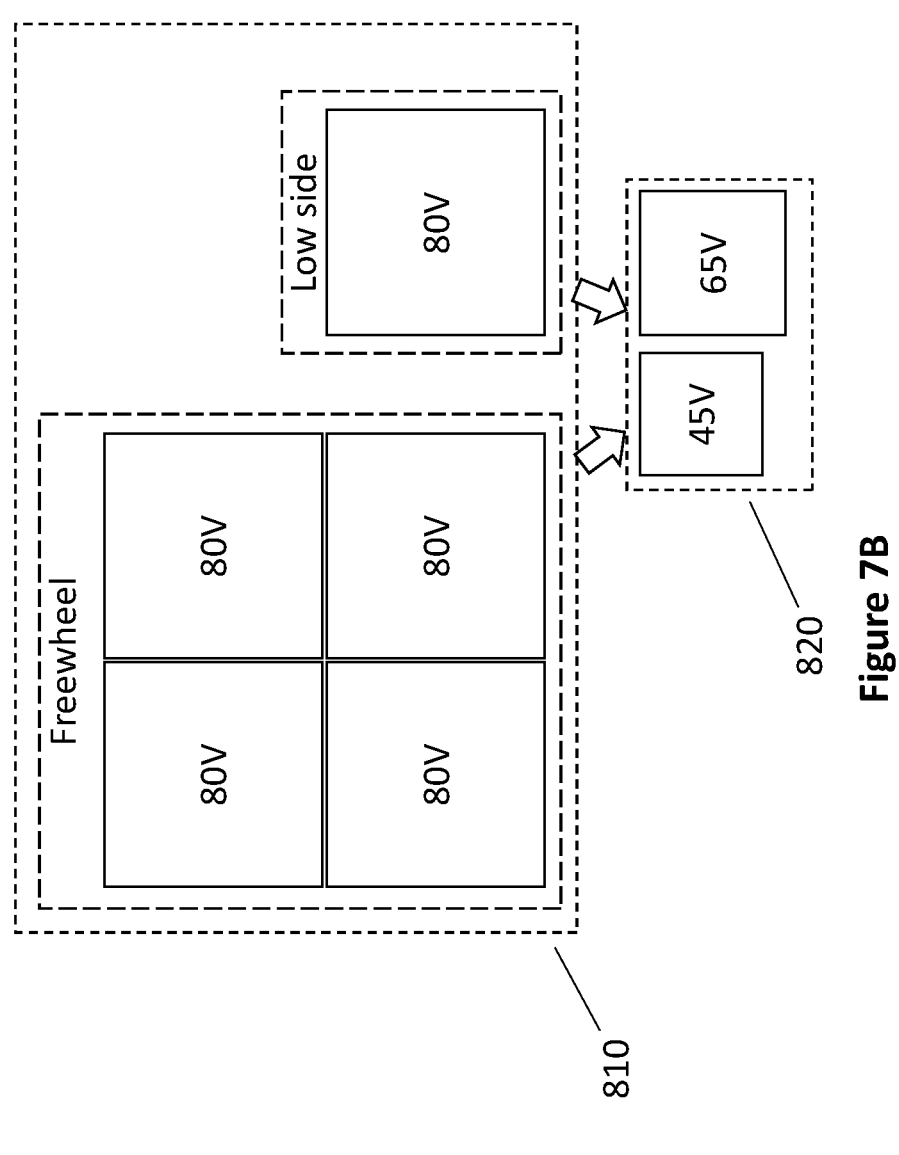
FIG. 7B is a diagram showing the area occupied by the power switches in the driver of FIG. 1 compared to the area occupied by the power switches of the driver of FIG. 5.

FIG. 7B shows a direct comparison between the area occupied by the power switches in the original topology 810 for the circuit of FIG. 1 and the area occupied by the two power switches in the proposed topology 820 of FIG. 5. In the driver 520, the high-side power switch HS only needs to sustain the battery voltage, and the low-side power switch LS only needs to sustain the clamping voltage. Therefore, for a clamping voltage of 60V and a battery load of 40V, the high-side and low-side power switches only require a rating of 45V and 65V, respectively. This lower voltage rating for the power switches means that they can be smaller in size and therefore take up less circuit chip area.

The proposed topology in FIG. 5 requiring fewer power switches of a lower voltage rating decreases the area occu-pied on a chip and hence also reduces the manufacturing costs of the driver. In addition, the proposed design allows for high-voltage clamping and fast de-energization of the electromechanical device, hence improving safety and pre-venting damage to the contactor. The driver 520 also has the additional safety benefits of the electromechanical device not being activated in the event of a short-to-ground.

Figure 8B:
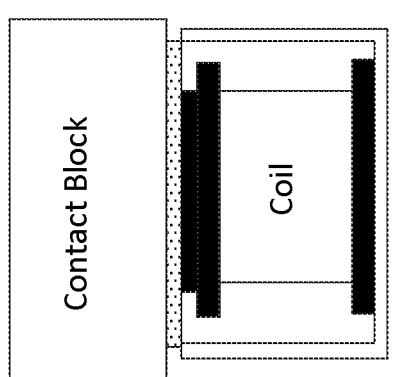
FIG. 8B is a side view of the contactor of FIG. 8A.
Figure 8A:
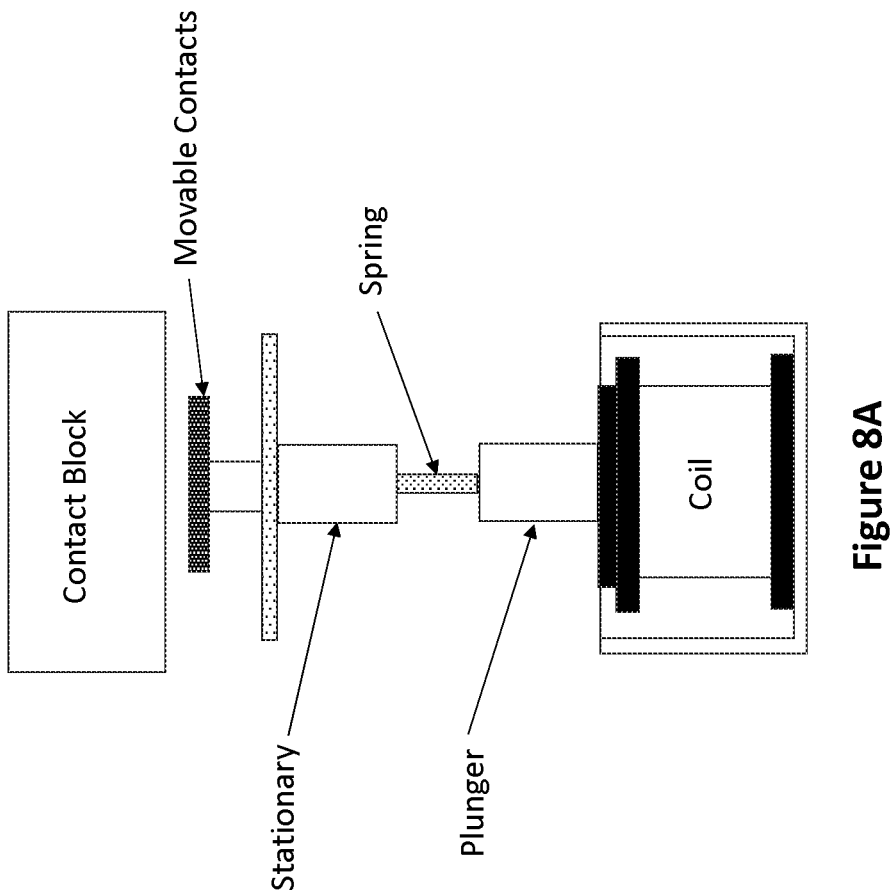
FIG. 8A is an exploded side view of a contactor.

FIG. 8A shows an exploded side view of an electrome-chanical device which is comprised of a solenoid and a mechanical switch. The mechanical switch includes a static contact member and a movable contact member. The sole-noid has a coil within which resides a plunger (see FIG. 8B) that is coupled to a spring. The spring connects the plunger to the movable contact member.

When a current flows through the coil, electromagnetic induction occurs which exerts a force on the plunger. Once this force exceeds the force of the spring and static friction, the plunger will begin to move bringing the moveable contact member closer to the static contact member. Even-tually, the two contacting surfaces will meet and the mechanical switch will be turned on. By discharging the current through the coil, the two contacting surfaces can be separated and the mechanical switch will be in the open position.

FIG. 8B shows a side view of the electromechanical device as it would normally appear when assembled. All that can be seen in this figure is the coil of the solenoid and the contact block.

Figures 9A, 9B:
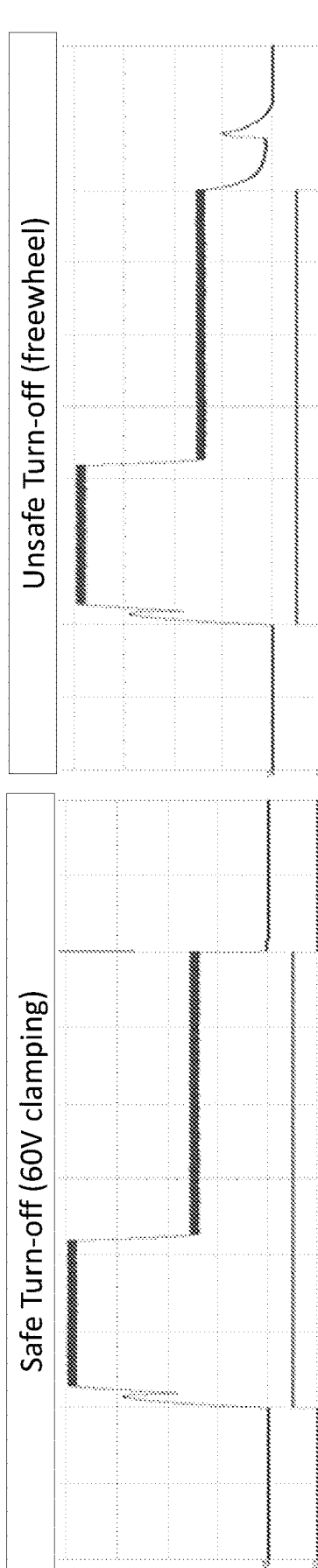
FIG. 9A is a diagram illustrating safe turn off.
FIG. 9B is a diagram illustrating unsafe turn off.

FIGS. 9A and 9B are diagrams showing the current as a function of time. FIG. 9A illustrates the case of a safe turn off as implemented by the embodiments described in the present disclosure, whilst FIG. 9B illustrates the case of unsafe turn off as has been implemented in the prior art.

In FIG. 9A, it can be seen that when implementing a high-voltage clamping circuit the energy in the coil is dissipated quickly as shown by the large and sharp drop at the point of 'deenergise coil'. This allows for the contacting surfaces of the mechanical switch to be opened as fast as possible. In other words, the high clamping voltage quickly de-energizes the coil, thereby allowing opening of the con-tactors as fast as possible.

In FIG. 9B, the unsafe turn off utilises a freewheel path only. The current continuously freewheels through the coil of the solenoid resulting in a slow de-energisation of the coil. This can lead to multiple opening and closing events of the mechanical switch as the slow movement of the plunger through the coil can cause the current to reverse direction causing a fluctuation in the force applied to the plunger as can been seen by the oscillation of the lower line in FIG. 9B. In other words, the freewheel path allows slow de-magnetization of the coil; and as the plunger moves, the current is induced to reverse its direction. Thus, multiple openings and closings of the mechanical switch can be caused, which extends and worsens the arcing. As a result, welded contact condition can be caused.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

The invention claimed is:

1. A driver for driving an electromechanical device comprising a solenoid and a mechanical switch; the driver comprising:
   an input port connectable to a battery;
   a ground port connected to ground;
   a first output port and a second output port connectable to the electromechanical device; wherein the first output port is connected to ground via a ground diode;
   a high-side power switch;
   a low-side power switch; and
   a controller coupled to the high-side power switch and the low-side power switch; the controller being operable in a first mode to charge the solenoid and close the mechanical switch, a second mode to maintain the mechanical switch closed, and a third mode to discharge the solenoid and open the mechanical switch; wherein in the first mode and the second mode, the low-side power switch is on and the high-side power switch is controlled to switch between an on-state and an off-state by the controller, such that in the on-state a path is formed between the input port and ground via the high-side power switch, the solenoid and the low-side power switch; and in the off-state a path is formed between ground and ground via the ground diode, the solenoid and the low-side power switch, and wherein during the third mode the solenoid is discharged through the low-side power switch controlled by a Zener trigger, a clamping trigger path is provided parallel to the low-side power switch, and the clamping trigger path comprises a diode, a Zener diode and a resistor.

2. The driver as claimed in claim 1, wherein the first mode comprises a first phase during which the low-side power switch and the high-side power switch are both on until a target current is reached through the solenoid, and a second phase during which the high-side power switch switches between the on-state and the off-state to maintain the target current through the solenoid.

3. The driver as claimed in claim 1, wherein the second mode comprises a first phase during which the controller operates in the off-state to drop a current through the solenoid to a second target value, and a second phase during which the high-side power switch switches between the on-state and the off-state to maintain the current through the solenoid at the second target value.

4. The driver as claimed in claim 1, wherein the driver is a contactor driver for driving a contactor.

5. The driver as claimed in claim 1 further comprising a multiplexer.

6. The driver as claimed in claim 1 further comprising a digital circuit.

7. The driver as claimed in claim 6, wherein the digital circuit is adapted to measure a feedback current and update the controller according to a value of the feedback current.

8. The driver as claimed in claim 1, wherein the high-side power switch and the low-side power switch have different voltage ratings.

9. The driver as claimed in claim 1, wherein the high-side power switch has a voltage rating defined by a battery voltage provided at the input port.

10. The driver as claimed in claim 1, wherein the low-side power switch has a voltage rating defined by a clamping voltage of the clamping trigger path.

11. The driver as claimed in claim 1, wherein the controller is configured to perform pulse width modulation.

12. The driver as claimed in claim 1, wherein the mechanical switch comprises a static contact member and a movable contact member.

13. An electromechanical system comprising an electromechanical device coupled to the driver of claim 1.

14. A method for driving an electromechanical device comprising a solenoid and a mechanical switch; the method comprising:
   providing a driver comprising an input port connectable to a battery; a ground port connected to ground; a first output port and a second output port connectable to the electromechanical device; wherein the first output port is connected to ground via a ground diode; the driver further comprising a high-side power switch; a low-side power switch; and a controller coupled to the high-side power switch and the low-side power switch, wherein a clamping trigger path is provided parallel to the low-side power switch, and the clamping trigger path comprises a diode, a Zener diode and a resistor;
   operating the controller in a first mode to charge the solenoid and close the mechanical switch;
   operating the controller in a second mode to maintain the mechanical switch closed;
   wherein in the first mode and the second mode, the low-side power switch is on and the high-side power switch is controlled to switch between an on-state and an off-state by the controller, such that in the on-state a path is formed between the input port and ground via the high-side power switch, the solenoid and the low-side power switch; and in the off-state a path is formed between ground and ground via the ground diode, the solenoid and the low-side power switch; and
   operating the controller in a third mode to discharge the solenoid through the low-side power switch controlled by a Zener trigger and open the mechanical switch.

15. The method of operating the driver as claimed in claim 14, wherein the second mode comprises a first phase during which the controller operates in the off-state to drop a current through the solenoid to a second target value, and a second phase during which the controller operates to maintain the current through the solenoid at the second target value.

* * * * *